United States Patent [19]

Ohtateme et al.

[11] Patent Number: 5,579,327
[45] Date of Patent: Nov. 26, 1996

[54] EXTERNAL-CAVITY TUNABLE WAVELENGTH LIGHT SOURCE USING SEMICONDUCTOR LASER HAVING PHASE ADJUSTMENT AREA

[75] Inventors: Hiroaki Ohtateme, Atsugi; Hiroaki Endoh; Hiroshi Goto, both of Isehara; Ko Ikeuchi, Hadano; Akihiko Asai, Tokyo, all of Japan

[73] Assignee: Anritsu Corporation, Tokyo, Japan

[21] Appl. No.: 465,063

[22] Filed: Jun. 5, 1995

[30] Foreign Application Priority Data

Jun. 6, 1994 [JP] Japan .................................. 6-147182
Jul. 4, 1994 [JP] Japan .................................. 6-174777

[51] Int. Cl.⁶ .................................................. H01S 3/10
[52] U.S. Cl. ............................ 372/20; 372/38; 372/44
[58] Field of Search .............................. 372/20, 44, 46, 372/50, 38

[56] References Cited

U.S. PATENT DOCUMENTS 5,255,273 10/1993 Nilsson et al. .
5,379,318 1/1995 Weber ........................................ 372/50

FOREIGN PATENT DOCUMENTS

2-156691 6/1990 Japan .
3-129890 6/1991 Japan .

Primary Examiner—Rodney B. Bovernick
Assistant Examiner—Robert E. Wise
Attorney, Agent, or Firm—Frishauf, Holtz, Goodman, Langer & Chick

[57] ABSTRACT

In an external-cavity tunable wavelength light source using a semiconductor laser (LD), an oscillation wavelength is tuned by simultaneously changing a current to be injected to the phase adjustment area of the LD and the rotation angle of a diffraction grating while holding the same external cavity longitudinal mode. A light beam emitted from the AR-coated end face of the LD having the phase adjustment area is collimated by a lens and incident on the diffraction grating. Only a light component having a specific wavelength selected upon spectral dispersion is reflected by the diffraction grating and returns to the LD. With this operation, an external cavity (effective cavity length K) is formed between the LD and the diffraction grating, thereby performing laser oscillation at a wavelength determined by an external cavity longitudinal mode and the cavity loss of the diffraction grating. The effective cavity length K can be changed in accordance with the current to be injected to the phase adjustment area. A current injection unit injects the current to the phase adjustment area. An oscillation wavelength control unit controls the injection current output from the current injection unit and the rotation angle of the diffraction grating.

20 Claims, 9 Drawing Sheets

EXTERNAL-CAVITY TUNABLE WAVELENGTH LIGHT SOURCE USING SEMICONDUCTOR LASER HAVING PHASE ADJUSTMENT AREA

BACKGROUND OF THE INVENTION

1. Field of the Invention

The present invention relates to an external-cavity tunable wavelength light source using a semiconductor laser and, more particularly, to a tunable wavelength light source capable of tuning the oscillation wavelength of a laser beam with a high reproducibility and a high resolution.

The present invention also relates to an external-cavity tunable wavelength light source using a semiconductor laser and, more particularly, to a tunable wavelength light source which uses a semiconductor laser having a phase adjustment area to achieve size reduction of the apparatus.

2. Description of the Related Art

Figure 8:
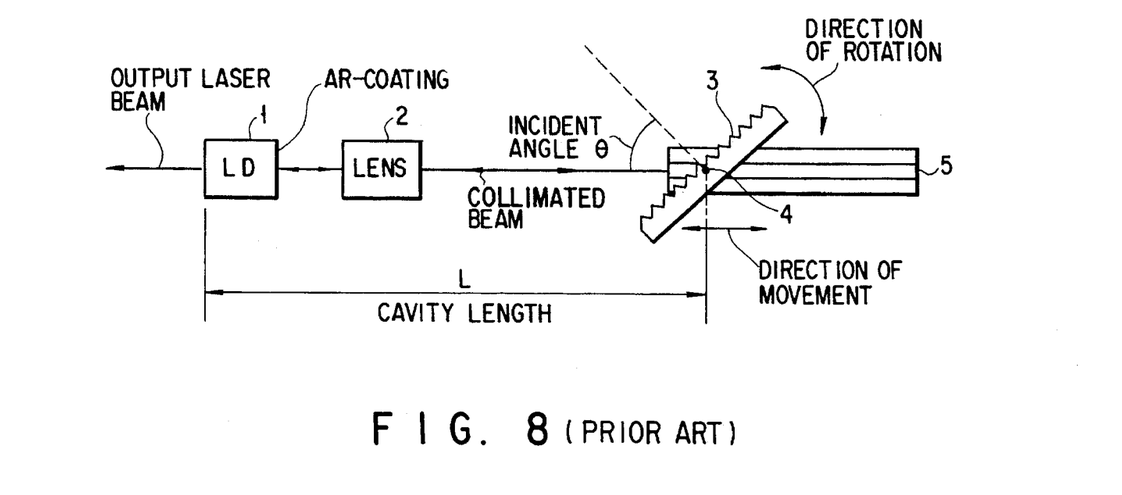
FIG. 8 is a block diagram showing the arrangement of a conventional tunable wavelength light source.

A light source for selecting a wavelength by an external diffraction grating is conventionally known as a typical external-cavity tunable wavelength light source using a semiconductor laser. FIG. 8 is a block diagram showing the arrangement of this prior art.

Referring to FIG. 8, a light beam emitted from the AR-coated (AR: Anti-Reflection) end face of a semiconductor laser (LD) 1 is collimated by a lens 2 and incident on a diffraction grating 3. The light beam is spectrally dispersed, and only a light component having a specific wavelength returns to the LD 1 (to be described later). With this operation, a cavity (external cavity) is formed between an end face of the LD 1, which is not AR-coated, and the diffraction grating 3, and laser oscillation is performed at a wavelength determined by a cavity length L. The output laser beam is emitted from the end face of the LD 1, which is not AR-coated.

The principle of laser oscillation will be described below.

Figure 9:
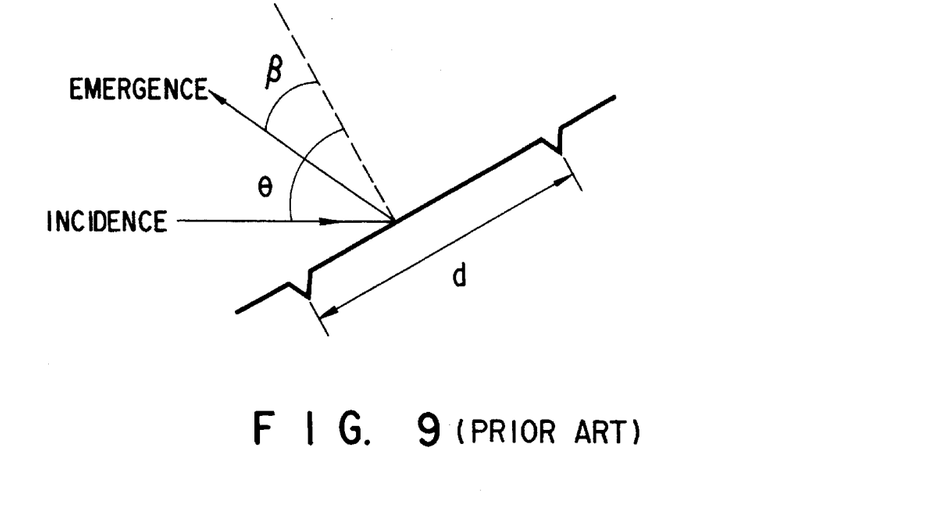
FIG. 9 is a view for explaining the operation of a diffraction grating.

The diffraction angle of a light beam incident on the diffraction grating 3 changes in accordance with its wavelength. More specifically, a wavelength $\lambda$ for obtaining an exit angle $\beta$ satisfies the following relation:

$$m\lambda = d(\sin\theta + \sin\beta), \text{ (m is a diffracted order=0, ±1,±2, ...)} \quad (1)$$

where d is the grating constant of the diffraction grating 3, and $\theta$ is the incident angle to the diffraction grating 3, as shown in FIG. 9.

Figure 10:
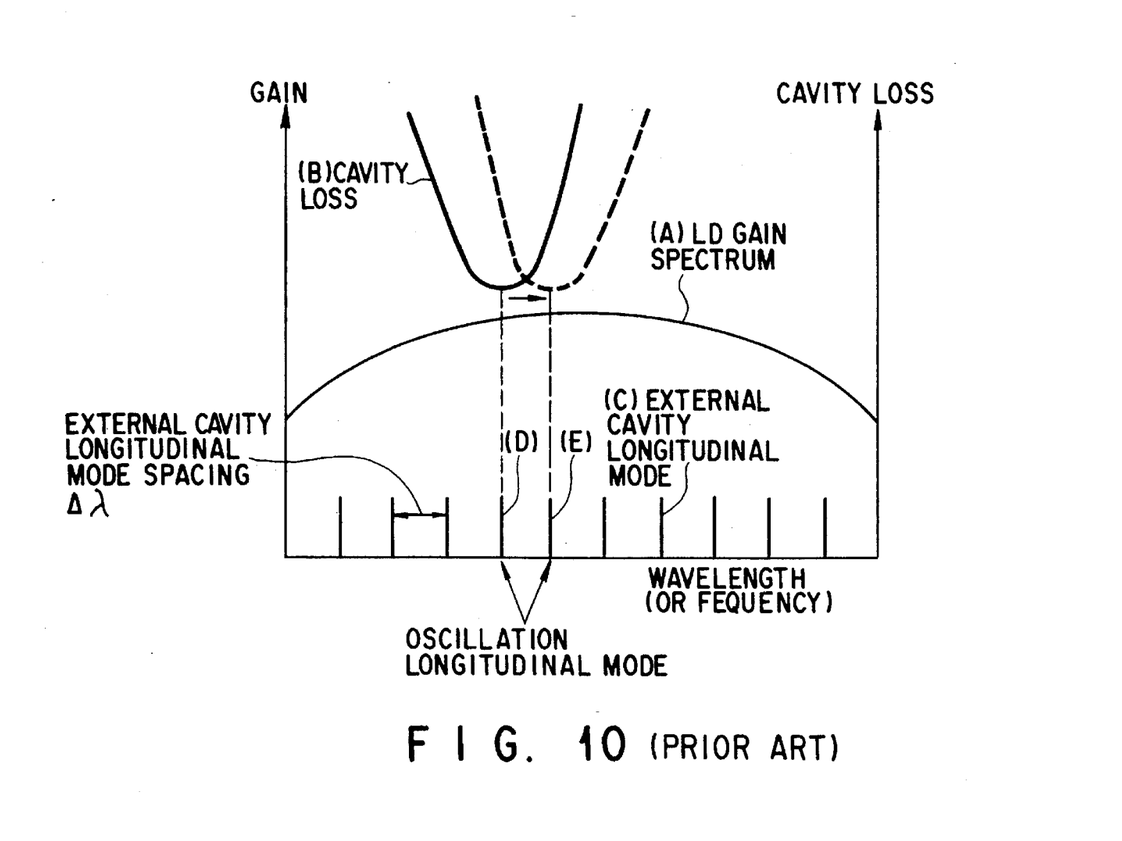
FIG. 10 is a graph for explaining the principle of oscillation of an external-cavity tunable wavelength light source.

From the light beam incident on the diffraction grating 3, a light component having a wavelength satisfying $\theta=\beta$ in accordance with equation (1) returns to the LD 1, thereby forming an external cavity (cavity length L). The wavelength oscillated at this time is determined by the gain spectrum (A) of the LD 1, the wavelength characteristics (B) of a cavity loss which is mainly determined by the characteristics of the diffraction grating 3, and an external cavity longitudinal mode (C) determined by optical phase conditions, as shown in FIG. 10. More specifically, an external cavity longitudinal mode for maximizing a value obtained by subtracting the loss (B) from the gain (A) oscillates. In FIG. 10, oscillation longitudinal modes are external cavity longitudinal modes (D) and (E).

The external cavity longitudinal mode is a condition for forming a standing wave upon reciprocation of a light beam in the cavity, which is given by the following equation:

$$n\lambda = 2L \text{ (n is a natural number, and L is the above-described cavity length)} \quad (2)$$

An external cavity longitudinal mode spacing $\Delta\lambda$ at this time is represented as follows:

$$\Delta\lambda = \lambda^2/2L \quad (3)$$

The wavelength characteristics (B) of the cavity loss can be changed, as indicated by a dotted line in FIG. 10, by changing the incident angle $\theta$ to the diffraction grating 3 in FIG. 8. Additionally, the wavelength of the external cavity longitudinal mode (C) can be changed by moving the diffraction grating 3 along the moving direction shown in FIG. 8 (in other words, by changing the cavity length L).

Therefore, in the prior art shown in FIG. 8, a laser beam having a designated wavelength $\lambda s$ can be output from the LD 1 in the following manner.

(1) A rotating shaft 4 of the diffraction grating 3 is rotated to equalize the wavelength of the laser beam incident from the diffraction grating 3 onto the LD 1 with the designated wavelength $\lambda s$.

That is, the incident angle $\theta$ is changed to satisfy equation (1).

(2) The rotating shaft 4 of the diffraction grating 3 is moved along a guide groove 5 to adjust the cavity length L such that equation (2) is satisfied.

The adjustment (2) must be performed once when a wavelength is to be oscillated at the external cavity longitudinal mode spacing $\Delta\lambda$ shown in FIG. 10. However, when a wavelength is to be oscillated within the external cavity longitudinal mode spacing $\Delta\lambda$, the adjustment must be performed whenever the wavelength changes.

The tunable wavelength light source apparatus with the arrangement as shown in FIG. 8 poses the following problems.

To adjust the cavity length L (in other words, to oscillate a waveform within the external-cavity longitudinal mode spacing $\Delta\lambda$) as in the adjustment (2), the rotating shaft 4 of the diffraction grating 3 must be moved along the guide groove 5. For this purpose, an electrically driven actuator, a piezoelectric element, or the like is used, which mechanically changes the cavity length L and poses the following problems.

(a) Use of Actuator (a1) The reproducibility of the oscillation wavelength tends to be degraded because of backlash of the actuator.

(a2) It is difficult to precisely set the resolution of the oscillation wavelength because the actuator has difficulty in finely setting a length.

The reproducibility and resolution of the oscillation wavelength will be exemplified as detailed values.

A change in wavelength $\Delta\lambda'$ when the cavity length L is changed by only $\Delta L$ is represented as follows:

$$\Delta\lambda' = \lambda \times (\Delta L/L) \quad (4)$$

where $\lambda$ is the initial wavelength.

When the cavity length L is set to 30 mm, the initial wavelength $\lambda$ is set to 1.55 $\mu$m which is often used in a communication band, and a highly precise compact actuator having normal performance such as a length reproducibility of 1 $\mu$m and a length resolution of 20 nm is used as an actuator, the reproducibility and resolution of the oscillation wavelength are obtained in accordance with equation (4).

The reproducibility of the oscillation wavelength is represented as follows:

$$\Delta\lambda' = (1.55 \times 10^{-6}) \times \{(1 \times 10^{-6})/(30 \times 10^{-3})\} \neq 50 \text{ pm} \quad (5)$$

The resolution of the oscillation wavelength is represented as follows:

$$\Delta\lambda' = (1.55 \times 10^{-6}) \times \{(20 \times 10^{-9})/(30 \times 10^{-3})\} \neq 1 \text{ pm} \quad (6)$$

(b) Use of Piezoelectric Element

The reproducibility of the oscillation wavelength is degraded because of the hysteresis of the piezoelectric element (free to extend upon application of a voltage). A practical value will be exemplified below.

When a normal piezoelectric element having a hysteresis of 10% with respect to the variable width of the length is used, and the variable width of the length is set to 2 μm, the length reproducibility is obtained as follows:

$$(2 \times 10^{-6}) \times 0.1 = 0.2 \text{ μm} \quad (7)$$

When L=30 mm, and λ=1.55 μm, the reproducibility of the oscillation length can be calculated from the above result and equation (4) as follows:

$$\Delta\lambda' = (1.55 \times 10^{-6}) \times \{(0.2 \times 10^{-6})/(30 \times 10^{-3})\} \neq 10 \text{ pm} \quad (8)$$

The practical values of the reproducibility and resolution of the oscillation wavelength in cases (a) and (b) are poorer than those of the present invention (to be described later) by about 10 to 50 times.

In addition, in the tunable wavelength light source with the above arrangement, a driving component (not shown in FIG. 8) such as an electrically driven actuator or a piezoelectric element is attached to the diffraction grating 3 to move the rotating shaft 4 of the diffraction grating 3 along the guide groove 5, thereby adjusting the cavity length L, as described in (2) (in other words, oscillating a wavelength within the external-cavity longitudinal mode spacing Δλ).

As a result, the guide groove 5, the driving component, and the like are needed to adjust the cavity length L. An increase in number of components results in a bulky apparatus and a complex driving method. The increase in number of components and the mechanical nature of the driving component adversely affect the reliability.

SUMMARY OF THE INVENTION

It is, therefore, an object of the present invention to provide a new and improved tunable wavelength light source which can solve the above problems and realize a high-performance tunable wavelength light source with a high reproducibility and a high resolution by a simple control manner.

It is another object of the present invention to provide a high-performance tunable wavelength light source which can solve the above problems and tune an oscillation wavelength by a simple control manner.

According to a first aspect of the present invention, there is provided a tunable wavelength light source, comprising:

a semiconductor laser having first and second end faces capable of emitting a laser beam and opposing each other, and a phase adjustment area, the first end face being AR-coated;

a diffraction grating, arranged on an optical path of the laser beam emitted from the first end face, for spectrally dispersing the laser beam emitted from the first end face of the semiconductor laser and returning only a light component having a specific wavelength to the first end face, thereby forming an external cavity having a cavity length corresponding to a distance between the second end face of the semiconductor laser and a spectral dispersion surface of the diffraction grating, the external cavity oscillating an external cavity longitudinal mode based on the cavity length;

current injection means for injecting a current to the phase adjustment area of the semiconductor laser, thereby changing an effective cavity length of the external cavity; and oscillation wavelength control means for controlling a current value to be injected from the current injection means and controlling a wavelength to be selected by the diffraction grating so as to oscillate a light beam having a desired wavelength between the external cavity longitudinal modes in order that the wavelength of the laser beam emitted from the second end face of the semiconductor laser can be changed while holding a predetermined cavity length of the external cavity.

According to a second aspect of the present invention, there is provided a tunable wavelength light source, comprising:

a semiconductor laser having first and second end faces opposing each other and a phase adjustment area, the first end face being capable of emitting a laser beam and AR-coated, and the second end face being HR-coated;

a diffraction grating, arranged on an optical path of the laser beam emitted from the first end face, for spectrally dispersing the laser beam emitted from the first end face of the semiconductor laser and returning only a light component having a specific wavelength to the first end face, thereby forming an external cavity having a cavity length corresponding to a distance between the second end face of the semiconductor laser and a spectral dispersion surface of the diffraction grating, the external cavity oscillating an external cavity longitudinal mode based on the cavity length;

current injection means for injecting a current to the phase adjustment area of the semiconductor laser, thereby changing an effective cavity length of the external cavity; and oscillation wavelength control means for controlling a current value to be injected from the current injection means and controlling a wavelength to be selected by the diffraction grating so as to oscillate a light beam having a desired wavelength between the external cavity longitudinal modes in order that the wavelength of the laser beam emitted from a direction of total reflection of the diffraction grating can be changed while holding a predetermined cavity length of the external cavity.

According to a third aspect of the present invention, there is provided a tunable wavelength light source, comprising:

a semiconductor laser having first and second end faces capable of emitting a laser beam and opposing each other, and a phase adjustment area, the first end face being AR-coated;

a reflector, having a wavelength selectivity for receiving the laser beam emitted from the first end face of the semiconductor laser and reflecting only a light component having a specific wavelength of the laser beam to the first end face and arranged on an optical path of the laser beam emitted from the first end face to form an external cavity having a cavity length corresponding to a distance between the second end face of the semiconductor laser and a reflection surface of the reflector, the external cavity oscillating an external cavity longitudinal mode based on the cavity length;

current injection means for injecting a current to the phase adjustment area of the semiconductor laser, thereby changing an effective cavity length of the external cavity; and oscillation wavelength control means for controlling a current value to be injected from the current injection means and controlling a wavelength to be selected by the reflector so as to oscillate a light beam having a desired wavelength between the external cavity longitudinal modes in order that the wavelength of the laser beam emitted from the second end face of the semiconductor laser can be changed while holding a predetermined cavity length of the external cavity.

According to a fourth aspect of the present invention, there is provided a tunable wavelength light source, comprising:

a semiconductor laser having first and second end faces opposing each other and a phase adjustment area, the first end face being capable of emitting a laser beam and AR-coated, and the second end face being HR-coated;

a reflector, having a wavelength selectivity for receiving the laser beam emitted from the first end face of the semiconductor laser and reflecting only a light component having a specific wavelength of the laser beam to the first end face and arranged on an optical path of the laser beam emitted from the first end face to form an external cavity having a cavity length corresponding to a distance between the second end face of the semiconductor laser and a reflection surface of the reflector, the external cavity oscillating an external cavity longitudinal mode based on the cavity length;

current injection means for injecting a current to the phase adjustment area of the semiconductor laser, thereby changing an effective cavity length of the external cavity; and oscillation wavelength control means for controlling a current value to be injected from the current injection means and controlling a wavelength to be selected by the reflector so as to oscillate a light beam having a desired wavelength between the external cavity longitudinal modes in order that the wavelength of the laser beam emitted from a direction of total reflection of the reflector can be changed while holding a predetermined cavity length of the external cavity.

More specifically, to solve the above problems, the first and second aspects of the present invention pay attention to the following points. That is, when an LD having a phase adjustment area is used, and a current to be injected to the phase adjustment area is changed, the effective cavity length of an external cavity can be changed. In addition, when a diffraction grating is rotated about its rotating shaft, a predetermined cavity length of the external cavity can be maintained.

Therefore, a tunable wavelength light source according to the first and second aspects of the present invention comprises an LD having a phase adjustment area for changing the effective cavity length of an external cavity in accordance with a current to be injected, current injection means for injecting the current to the phase adjustment area, and oscillation wavelength control means for controlling the current injected from the current injection means and the wavelength selected by the diffraction grating so as to oscillate the light source at a desired wavelength while holding a predetermined cavity length of the external cavity.

Note that the cavity length here means the cavity length of the external cavity formed between an LD having no phase adjustment area (or an LD having a phase adjustment area to which no current is injected) and the diffraction grating. Therefore, a predetermined cavity length is maintained as far as the distance between the LD and the diffraction grating is not mechanically changed, as indicated by the cavity length L in FIG. 8.

The effective cavity length means a length defined in considering the effective optical path of the phase adjustment area, which changes in accordance with the current to be injected to the phase adjustment area of the LD. Therefore, the effective cavity length is electrically changed in accordance with the current to be injected to the phase adjustment area when a predetermined cavity length is being held (in other words, the distance between the LD and the diffraction grating is not mechanically changed).

In the prior art, the cavity length of the external cavity is mechanically changed using an electrically driven actuator or a piezoelectric element, thereby changing the oscillation wavelength. In the first and second aspects of the present invention, however, the current to be injected to the phase adjustment area of the LD is changed (the effective cavity length of the external cavity is changed), and at the same time, the wavelength (rotation angle) selected by the diffraction grating is changed while a predetermined cavity length of the external cavity is held, thereby changing the oscillation wavelength.

To solve the above problems, the third and fourth aspects of the present invention pay attention to the following points. That is, when an LD having a phase adjustment area is used, and a current to be injected to the phase adjustment area is changed, the effective cavity length (corresponding to the cavity length L in the prior art) of an external cavity formed between the LD and the reflector can be changed.

Therefore, a tunable wavelength light source according to the third and fourth aspects of the present invention comprises an LD having a phase adjustment area for changing the effective cavity length of an external cavity in accordance with a current to be injected, current injection means for injecting the current to the phase adjustment area, and oscillation wavelength control means for controlling the current to be injected from the current injection means and the wavelength selected by a reflector having a wavelength selectivity so as to oscillate a light beam having a desired wavelength.

Note that the cavity length here means the cavity length of an external cavity formed between an LD having no phase adjustment area (or an LD having a phase adjustment area to which no current is injected) and a reflector having a wavelength selectivity (e.g., a diffraction grating)

The effective cavity length means a length defined in considering the effective optical path of the phase adjustment area, which changes in accordance with the current to be injected to the phase adjustment area of the LD. Therefore, when the effective cavity length is changed, the external cavity longitudinal mode is changed, thereby tuning the oscillation wavelength.

In the prior art, the cavity length of the external cavity is mechanically changed using an electrically driven actuator or a piezoelectric element, thereby changing the oscillation wavelength. In the third and fourth aspects of the present invention, however, the current to be injected to the phase adjustment area of the LD is changed (the effective cavity length of the external cavity is changed), and at the same time, the wavelength selected by the reflector having a wavelength selectivity is changed, thereby changing the oscillation wavelength.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principle of the invention.

DETAILED DESCRIPTION OF THE PREFERRED EMBODIMENTS

Reference will now be made in detail to the presently preferred embodiments of the invention as illustrated in the accompanying drawings, in which like reference characters designate like or corresponding parts throughout the several drawings.

Figure 1:
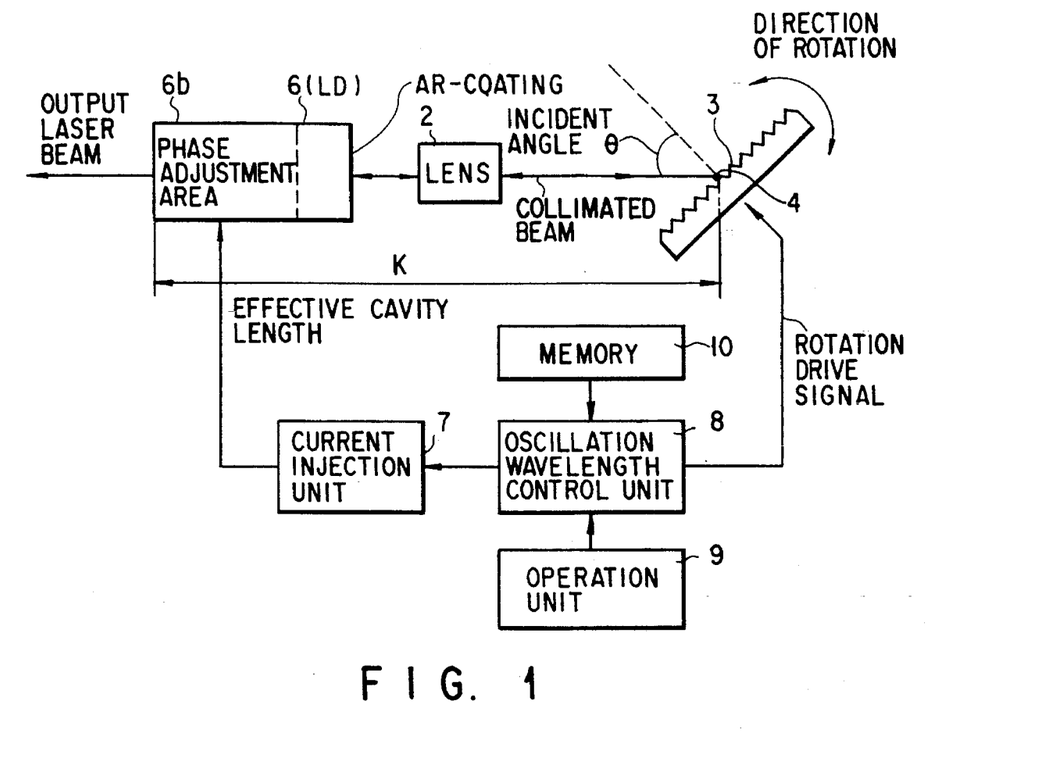
FIG. 1 is a block diagram of a tunable wavelength light source according to the first embodiment of the present invention.

The first and second embodiments of the present invention will be described below with reference to FIGS. 1 to 7.
(First Embodiment)
FIG. 1 is a block diagram of a tunable wavelength light source according to the first embodiment. The same reference numerals as in the prior art denote the same constituent elements in FIG. 1.

Figure 2:
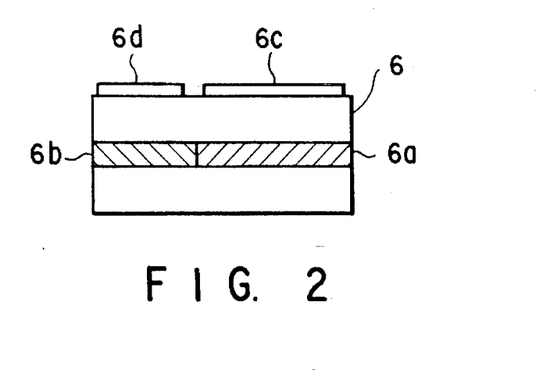
FIG. 2 is a view showing the arrangement of a two-electrode LD.

Referring to FIG. 1, an LD 6 is constituted by a two-electrode LD having a phase adjustment area and has an arrangement as shown in FIG. 2. In the two-electrode LD 6 shown in FIG. 2, the right area is an active area 6a having a light amplification function, which performs laser oscillation upon injection of a current from an electrode 6c. In the two-electrode LD 6 shown in FIG. 2, the left area is a phase adjustment area 6b having a function of tuning the wavelength of laser oscillation, in which, upon injection of a current from an electrode 6d, the refractive index changes due to the free plasma effect, and the effective optical path of the phase adjustment area 6b changes.

Referring to FIG. 1, a light beam emitted from the AR-coated end face of the LD 6 is collimated by a lens 2 and incident on a diffraction grating 3. Of the light beam spectrally dispersed by the diffraction grating 3, a wavelength component satisfying θ=β in accordance with equation (1) reversely moves along the same optical path and returns to the LD. With this operation, an external cavity (effective cavity length K) is formed between the end face of the LD 6, which is not AR-coated, and the diffraction grating 3. The external cavity performs laser oscillation at a wavelength determined by an external cavity longitudinal mode determined by the effective cavity length K, and the cavity loss by the diffraction grating 3.

A current injection unit 7 injects a current to the phase adjustment area 6b of the LD 6. With this operation, the effective optical path of the phase adjustment area 6b changes, and the effective cavity length K of the external cavity changes accordingly. An oscillation wavelength control unit 8 is constituted by a microprocessor or the like, which controls (sets) a current to be injected from the current injection unit 7 to the phase adjustment area 6b on the basis of a designated wavelength λs to be oscillated, and outputs a rotation drive signal to the diffraction grating 3, thereby controlling (setting) an incident angle θ (selected wavelength) of the collimated beam onto the diffraction grating 3.

A case in which the oscillation wavelength is tuned will be described.

Assume that a current to be injected from the current injection unit 7 to the phase adjustment area 6b is fixed to a predetermined value (effective cavity length K is fixed), and only the rotation angle of the diffraction grating 3 is changed. In this case, a wavelength oscillates at an external cavity longitudinal mode spacing determined by the effective cavity length K. As shown in FIG. 10, when the rotation angle of the diffraction grating 3 is changed to change the cavity loss (B) indicated by a solid line to that indicated by a dotted line, the oscillation wavelength changes from the external cavity longitudinal mode (D) to the external cavity longitudinal mode (E).

Figure 3:
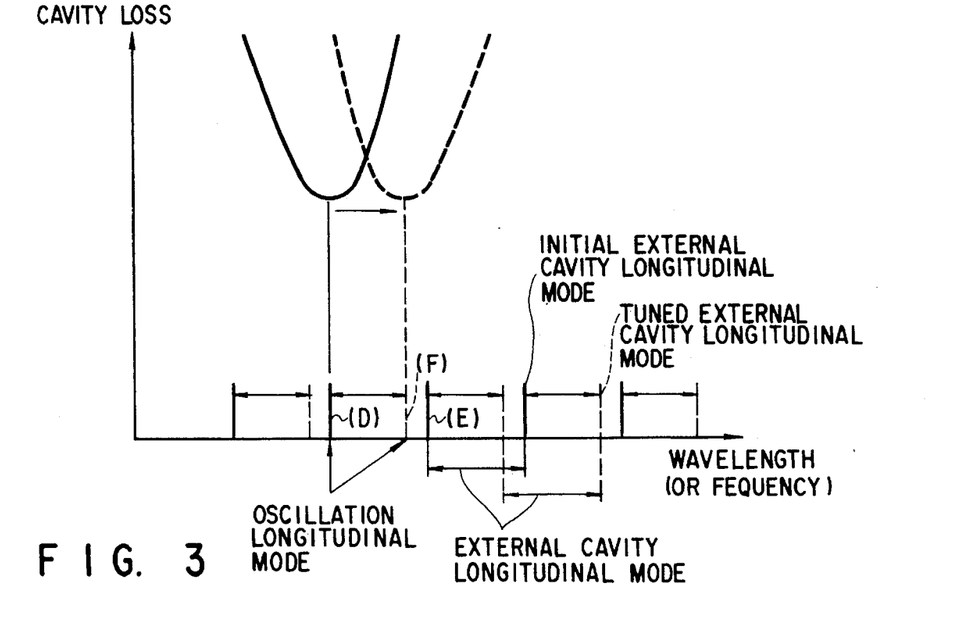
FIG. 3 is a graph showing a change in external cavity longitudinal mode due to an injection current to a phase adjustment area.

Assume that the current to be injected from the current injection unit 7 to the phase adjustment area 6b is changed (effective cavity length K is changed). In this case, as shown in FIG. 3, the initial external cavity longitudinal modes indicated by solid lines entirely change to those indicated by dotted lines. When the rotation angle of the diffraction grating 3 is also simultaneously changed, a wavelength can also be oscillated within the external cavity longitudinal mode spacing.

More specifically, when the current to be injected to the phase adjustment area 6b and the rotation angle of the diffraction grating 3 are simultaneously changed, the oscillation wavelength can be changed from the oscillation longitudinal mode indicated by the solid line to that indicated by the dotted line in FIG. 3.

In this case, when the wavelength of the external cavity longitudinal mode changes beyond at least one external cavity longitudinal mode spacing upon injection of a current to the phase adjustment area 6b, all wavelengths within a wavelength range between the external cavity longitudinal modes can be oscillated. In other words, an arbitrary wavelength (e.g., (F)) between the initial external cavity longitudinal modes (D) and (E) can be oscillated, as shown in FIG. 3.

Assuming that the designated wavelength $\lambda s$ is to be oscillated, a manner of setting and controlling the injection current to the phase adjustment area 6b and the rotation angle of the diffraction grating 3 will be described below with reference to steps S1 to S5 and S11 to S14 of the flow chart shown in FIG. 4.

(S1) The designated wavelength $\lambda s$ is set from an operation unit 9 such as a keyboard.

(S2) The oscillation wavelength control unit 8 receives the information of the designated wavelength $\lambda s$, (S11) calculates the incident angle $v$ of the diffraction grating 3, (S12) outputs a rotation drive signal corresponding to the incident angle $\theta$ to the diffraction grating 3, (S13) calculates the current value to be injected to the phase adjustment area 6b of the LD 6, and (S14) outputs the injection current value to the current injection unit 7.

Note that the current value is calculated on the basis of the characteristic data (relationship between the designated wavelength $\lambda s$ and the injection current value) of the phase adjustment area 6b, which is measured in advance and stored in a memory 10 (the memory 10 may be incorporated in the oscillation wavelength control unit 8).

(S3) The diffraction grating 3 is rotated in accordance with the rotation drive signal output from the oscillation wavelength control unit 8 to set the incident angle $\theta$.

(S4) The current injection unit 7 injects the current to the phase adjustment area 6b on the basis of the injection current value output from the oscillation wavelength control unit 8.

(S5) A laser beam having the designated wavelength $\lambda s$ is oscillated.

Figure 4:
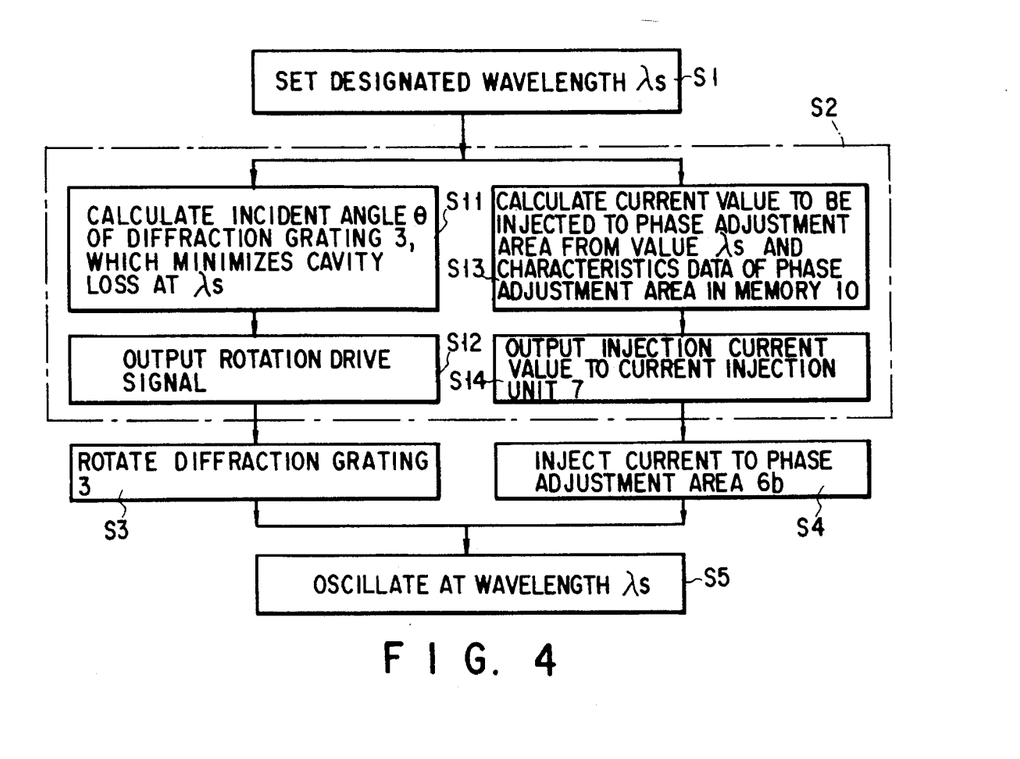
FIG. 4 is a flow chart showing a method of setting and controlling the injection current to the phase adjustment area and the rotation angle of a diffraction grating.
Figure 5:
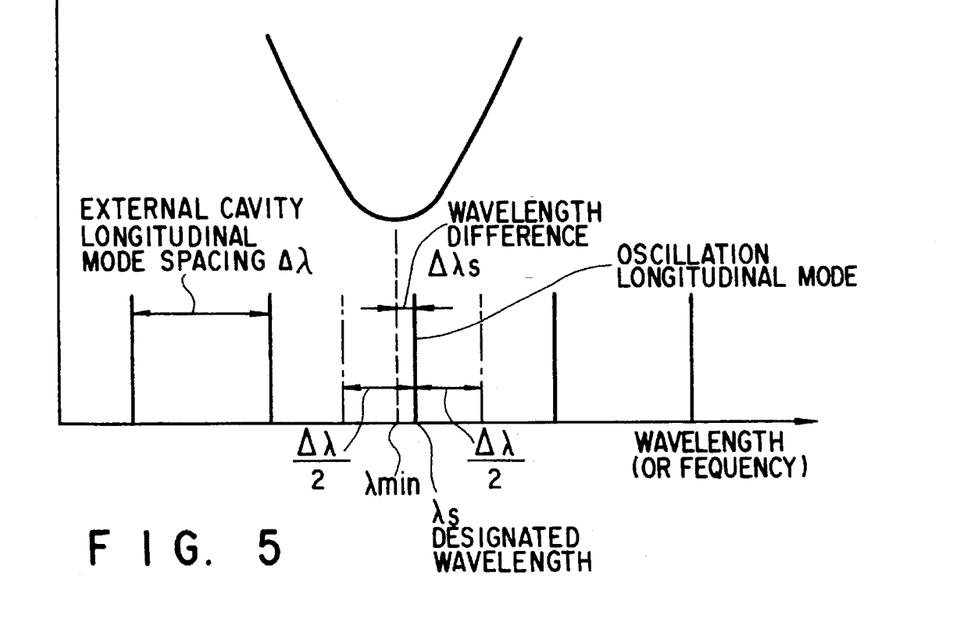
FIG. 5 is a graph for explaining the angle setting resolution of the diffraction grating and the setting resolution of the injection current to the phase adjustment area.

In oscillation of the designated wavelength $\lambda s$, as described in FIG. 4, if the angle setting resolution of the rotation mechanism of the diffraction grating 3 for setting the incident angle $\theta$ is lower than that of the designated wavelength $\lambda s$ (setting resolution of the current to be injected to the phase adjustment area 6b), a wavelength difference $\Delta \lambda s$ may be generated between a wavelength $\lambda min$ for minimizing the cavity loss and the designated wavelength $\lambda s$ in some cases, as shown in FIG. 5. In this case, however, as far as the wavelength difference $\Delta \lambda s$ is smaller than ½ an external cavity longitudinal mode spacing $\Delta \lambda$, oscillation is performed at the designated wavelength $\lambda s$. That is, the external cavity longitudinal mode set at the designated wavelength $\lambda s$ becomes the oscillation longitudinal mode. The diffraction grating 3 using a normal rotation mechanism has an angle setting resolution for suppressing the wavelength difference $\Delta \lambda s$ within a range of $\Delta \lambda/2$.

The first embodiment will be described below in more detail using practical values.

Assume that the initial effective cavity length K of the external cavity is set to 30 mm, and the initial wavelength $\lambda$ is set to 1.55 $\lambda$m. At this time, the external cavity longitudinal mode spacing $\Delta \lambda$ is obtained in accordance with equation (3) as follows:

$$\Delta \lambda = \lambda^2/2L \approx 40 \text{ pm} \quad (9)$$

Assume that, upon current injection from the current injection unit 7, the refractive index of the phase adjustment area 6b decreases by 0.2% from 3.5 to 3.493. In this case, when the mechanical length of the phase adjustment area 6b is 250 µm, the effective optical path of the phase adjustment area 6b decreases by 1.75 µm from 875 µm to 873.25 µm. Therefore, a change in effective cavity length K is −1.75 µm. A change in wavelength $\Delta \lambda'$ of the external cavity longitudinal mode is obtained in accordance with equation (4) as follows:

$$\Delta \lambda' = (1.55 \times 10^{-6}) \times \{(1.75 \times 10^{-6})/(30 \times 10^{-3})\} \approx 90.4 \text{ pm} \quad (10)$$

In accordance with equation (9), the external cavity longitudinal mode spacing $\Delta \lambda$ is calculated as 40 pm. Therefore, as described above, tunable oscillation can be performed within a wavelength range of about 90 pm which is twice or more the external cavity longitudinal mode spacing $\Delta \lambda$ while holding the same external cavity longitudinal mode.

Figure 6:
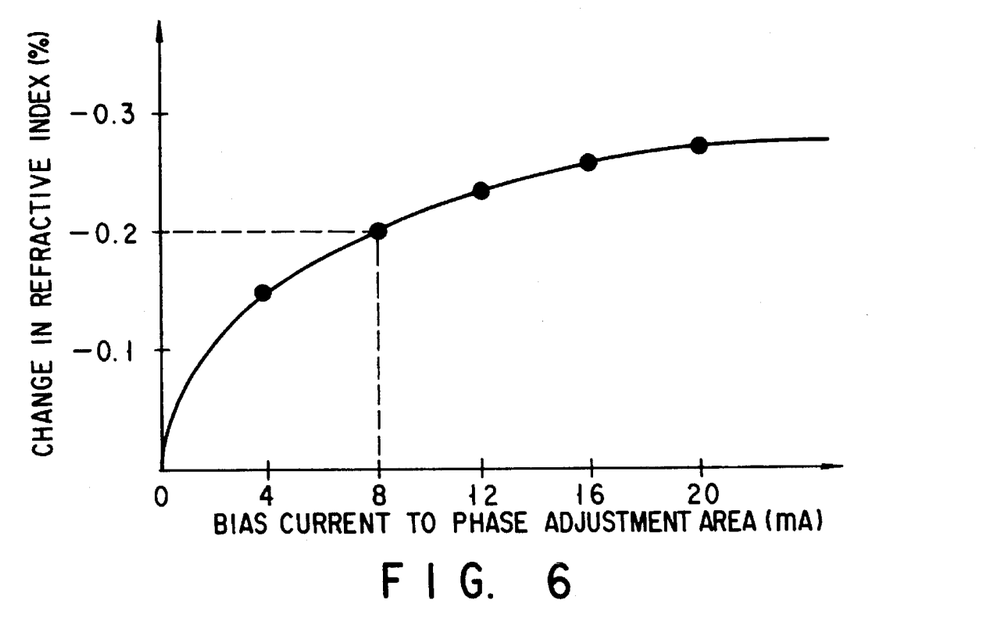
FIG. 6 is a graph showing the measurement value of a change in refractive index of the phase adjustment area.

FIG. 6 is a graph showing the measurement value of a change in refractive index of the phase adjustment area 6b when the bias current to be injected to the phase adjustment area 6b of the two-electrode LD 6 is changed (phase adjustment area length: 250 µm). As is apparent from FIG. 6, when the bias current is set to about 8 mA, a change in refractive index of 0.2% as described above can be realized.

In the tunable wavelength light source, it is preferable that a wide wavelength tunable range is obtained while holding the same external cavity longitudinal mode. The following two methods are used as a method of extending the tunable range.

As the first method, the mechanical length of the phase adjustment area 6b is increased. When the mechanical length of the phase adjustment area 6b, which exhibits the characteristics in FIG. 6, is increased from 250 µm to twice the length, i.e., 500 µm, a change in effective cavity length K increases by 1.5 times from −1.75 µm to −2.625 µm upon injection of the phase current of about 8 mA. Therefore, a wavelength tunable range 1.5 times that according to equation (10) can be obtained.

As the second method, the effective cavity length K of the external cavity is decreased. If the effective cavity length K is decreased from 30 mm to ½ the length, i.e., 15 mm, a wavelength tunable range twice that according to equation (10) can be obtained. In this case, however, the injection current to the phase adjustment area 6b is the same as in equation (10).

The reproducibility and resolution of the oscillation wavelength will be described below.

First of all, the reproducibility of the oscillation wavelength will be considered. As for the measurement value of a change in refractive index in FIG. 6, a reproducibility within a range of 1% is experimentally obtained. Therefore, when the wavelength is changed as calculated by equation (10), the reproducibility of the oscillation wavelength is represented as follows:

$$90.4 \text{ pm} \times 1\% < 1 \text{ pm} \qquad (11)$$

A reproducibility within a range of 1 pm can be obtained. This value is better than a value obtained in use of a highly precise compact actuator in the prior art, i.e., 50 pm (equation (5)) by 50 times or more and better than a value obtained in use of a piezoelectric element, i.e., 10 pm (equation (8)) by ten times or more.

The resolution of the oscillation wavelength will be considered below. When the wavelength changes as calculated by equation (10), the current to be injected to the phase adjustment area 6b can be realized by a change amount of about 8 mA, as described above. At this time, when the current injection unit 7 in FIG. 1 controls the bias current to be injected to the phase adjustment area 6b at a resolution of 1 µA, the resolution of the oscillation wavelength is represented as follows:

$$90.4 \text{ pm} \times (1 \text{ µA}/8 \text{ mA}) < 0.02 \text{ pm} \qquad (12)$$

A resolution within a range of 0.02 pm can be obtained. This value is better than a value obtained in use of the highly precise compact actuator in the prior art, i.e., 1 pm (equation (6)) by 50 times or more.

(Second Embodiment)

Figure 7:
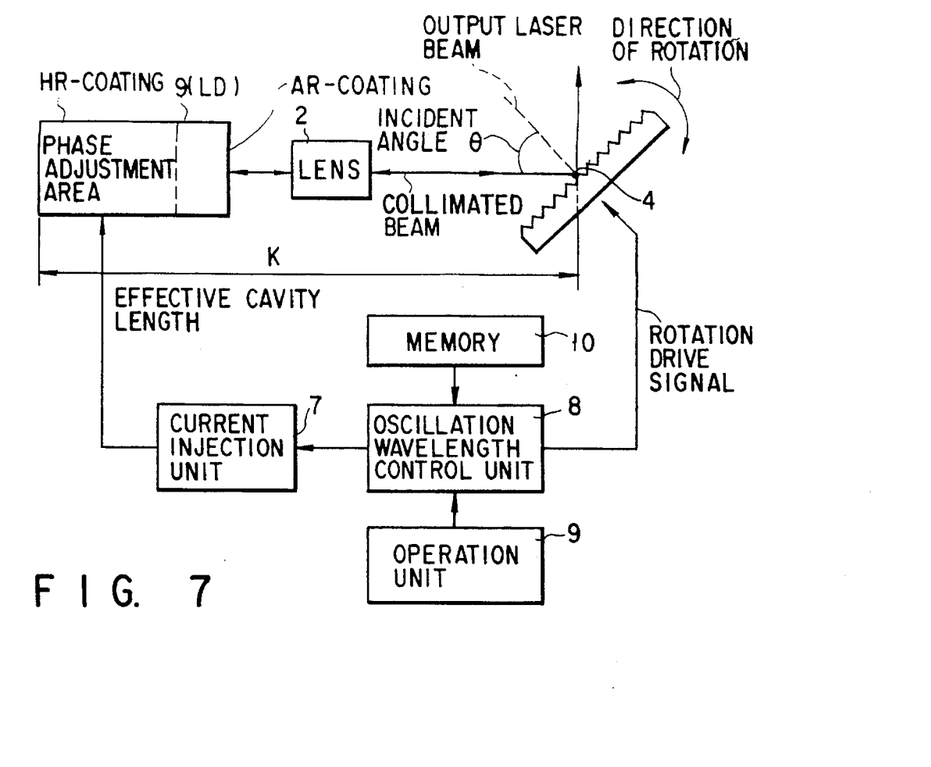
FIG. 7 is a block diagram of a tunable wavelength light source according to the second embodiment of the present invention.

FIG. 7 is a block diagram of a tunable wavelength light source according to the second embodiment.

This embodiment is different from the first embodiment in the following point. That is, an end face opposing the AR-coated end face of an LD 9 as a two-electrode LD is HR-coated (HR: High-Reflection), thereby extracting an output laser beam from a direction of 0th-order light (direction of total reflection) of a diffraction grating 3. Therefore, since the 0th-order light is used as output light, the output power increases as compared to the arrangement in FIG. 1.

(Another Embodiment)

In the above two embodiments, if the refractive index of the AR-coated end face of the LD 6 (or LD 9) is large, an internal longitudinal mode (Fabry-Pérot mode of a cavity formed between the AR-coated end face and the end face which is not AR-coated) may be generated in the LD 6 (or LD 9), and the set external cavity longitudinal mode may not oscillate. In this case, the following countermeasures are taken.

(1) AR coating at a higher quality is performed on the end face of the LD 6 (or LD 9), which is to be AR-coated.

(2) The diffraction grating 3 having a smaller grating constant d (FIG. 9) is used. Alternatively, the diameter of the lens 2 is increased to increase the diameter of the beam incident on the diffraction grating 3. With these methods, the wavelength characteristics of the cavity loss determined by the characteristics of the diffraction grating 3 are made steeper. That is, Q of the diffraction grating 3 is increased.

As described above, the tunable wavelength light source according to the first and second embodiments of the present invention comprises an LD having a phase adjustment area for changing the effective cavity length of an external cavity in accordance with a current to be injected, a current injection unit for injecting the current to the phase adjustment area, and an oscillation wavelength control unit for controlling the current to be injected from the current injection unit and controlling a wavelength to be selected by a diffraction grating. Therefore, the oscillation wavelength can be tuned at a high reproducibility and a high resolution, and the operability can also be largely improved.

The tunable wavelength light source according to the first and second embodiments of the present invention can be effectively applied to a heterodyne coherent optical communication system or wavelength multiplexing communication system, which requires an excellent reproducibility and a high resolution.

The third to seventh embodiments of the present invention will be described below with reference to FIGS. 11 to 18.

In these embodiments, a reflector is used in place of the diffraction grating used in the first and second embodiments. Note that the reflector can be realized using a diffraction grating.

These embodiments can be summarized as follows.

In an external-cavity tunable wavelength light source using a semiconductor laser (LD), a current to be injected to the phase adjustment area of the LD and a wavelength to be selected by a reflector are simultaneously changed. With this operation, the oscillation wavelength can be tuned while holding the same external cavity longitudinal mode. For this reason, a light beam emitted from the AR-coated end face of the LD having the phase adjustment area is converted into a parallel beam by a lens and incident on the reflector having a wavelength selectivity. Only a light component having a specific wavelength is reflected by the reflector and returns to the LD. With this operation, an external cavity (effective cavity length K) is formed between the LD and the reflector, and laser oscillation is performed at a wavelength determined by the external cavity longitudinal mode and the cavity loss of the reflector. Note that the effective cavity length K can be changed in accordance with the current to be injected to the phase adjustment area. A current injection unit injects a current to the phase adjustment area. An oscillation wavelength control unit controls the injection current output from the current injection unit and the wavelength to be selected by the reflector.

(Third Embodiment)

Figure 11:
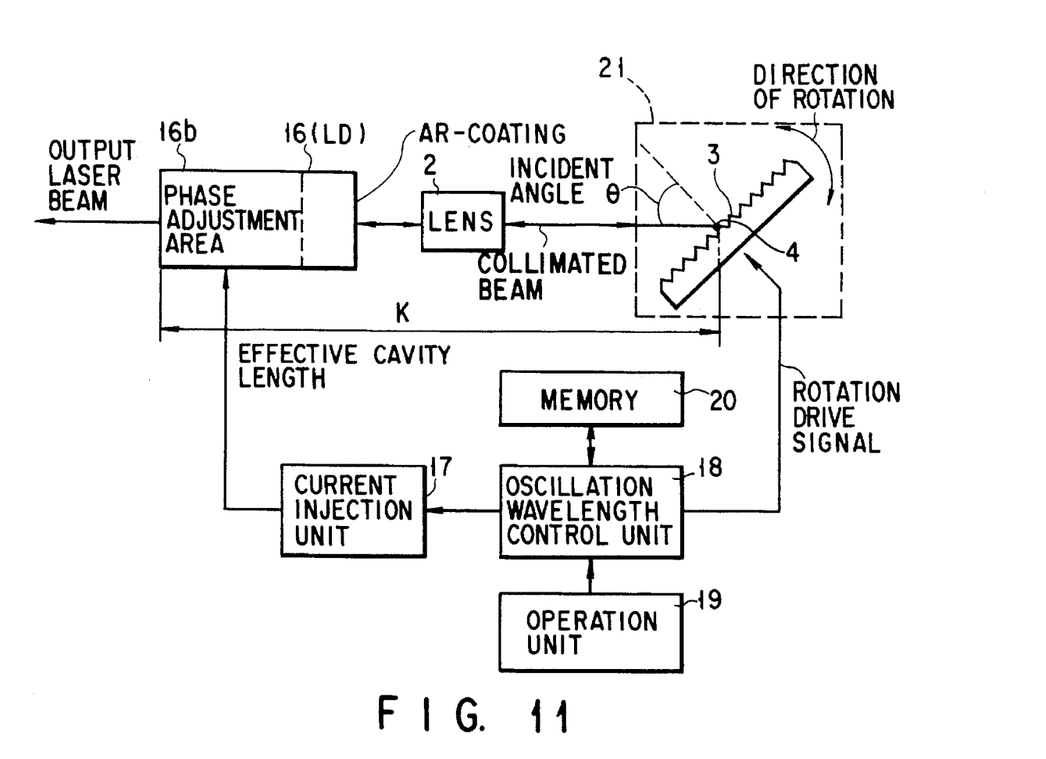
FIG. 11 is a block diagram of a tunable wavelength light source according to the third embodiment of the present invention.

FIG. 11 is a block diagram of a tunable wavelength light source according to the third embodiment. The same reference numerals as in the prior art denote the same constituent elements in FIG. 11.

Figure 12:
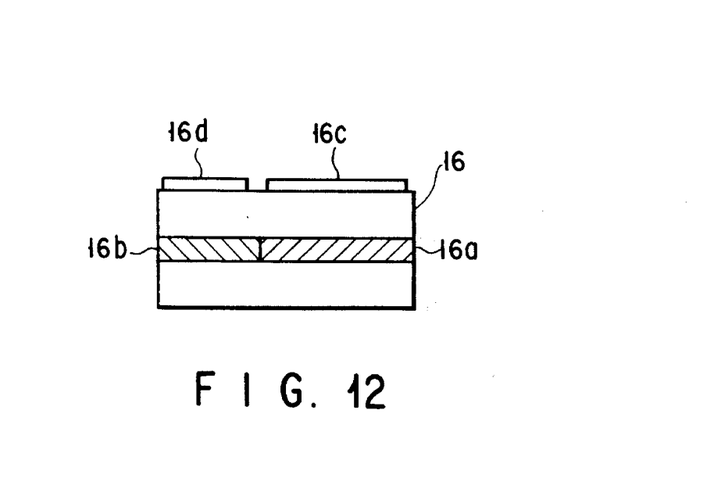
FIG. 12 is a view showing the arrangement of a two-electrode LD.

Referring to FIG. 11, an LD 16 is constituted by a two-electrode LD having a phase adjustment area and has an arrangement as shown in FIG. 12. In the two-electrode LD 16 shown in FIG. 12, the right area is an active area 16a having a light amplification function, which performs laser oscillation upon injection of a current from an electrode 16c. In the two-electrode LD 16 shown in FIG. 12, the left area is a phase adjustment area 16b having a function of tuning the wavelength of laser oscillation, in which, upon injection of a current from an electrode 16d, the refractive index changes due to the free plasma effect, and the effective optical path of the phase adjustment area 16b changes.

Referring to FIG. 11, a light beam emitted from the AR-coated end face of the LD 16 is collimated by a lens 2 and incident on a diffraction grating 3. Note that the diffraction grating 3 constitutes a reflector 21 having a wavelength selectivity. Of the light beam spectrally dispersed by the diffraction grating 3, a wavelength component satisfying θ=β in accordance with equation (1) reversely moves along the same optical path and returns to the LD 16. With this operation, an external cavity (effective cavity length K) is formed between the end face of the LD 16, which is not AR-coated, and the diffraction grating 3. The external cavity performs laser oscillation at a wavelength determined by an external cavity longitudinal mode determined by the effective cavity length K, and the cavity loss by the diffraction grating 3.

A current injection unit 17 injects a current to the phase adjustment area 16b of the LD 16. With this operation, the effective optical path of the phase adjustment area 16b changes, and the effective cavity length K of the external cavity changes accordingly. An oscillation wavelength control unit 18 is constituted by a microprocessor or the like, which controls (sets) a current to be injected from the current injection unit 17 to the phase adjustment area 16b on the basis of a designated wavelength λs to be oscillated, and outputs a rotation drive signal to the diffraction grating 3, thereby controlling (setting) an incident angle θ (selected wavelength) of the parallel beam onto the diffraction grating 3.

A case in which the oscillation wavelength is tuned will be described.

Assume that a current to be injected from the current injection unit 17 to the phase adjustment area 16b is fixed to a predetermined value (effective cavity length K is fixed), and only the rotation angle of the diffraction grating 3 is changed. In this case, a wavelength oscillates at an external cavity longitudinal mode spacing determined by the effective cavity length K. As shown in FIG. 10, when the rotation angle of the diffraction grating 3 is changed to change the cavity loss (B) indicated by a solid line to that indicated by a dotted line, the oscillation wavelength changes from the external cavity longitudinal mode (D) to the external-cavity longitudinal mode (E).

Assume that the current to be injected from the current injection unit 17 to the phase adjustment area 16b is changed (effective cavity length K is changed). In this case, as shown in FIG. 3, the initial external cavity longitudinal modes indicated by solid lines entirely change to those indicated by dotted lines. When the rotation angle of the diffraction grating 3 is also simultaneously changed, a wavelength can also be oscillated within the external cavity longitudinal mode spacing.

More specifically, when the current to be injected to the phase adjustment area 16b and the rotation angle of the diffraction grating 3 are simultaneously changed, the oscillation wavelength can be changed from the oscillation longitudinal mode indicated by the solid line to that indicated by the dotted line in FIG. 3 while holding the same external cavity longitudinal mode.

In this case, when the wavelength of the external cavity longitudinal mode changes beyond at least one external cavity longitudinal mode spacing upon injection of a current to the phase adjustment area 16b, all wavelengths within a wavelength range between the external cavity longitudinal modes can be oscillated. In other words, an arbitrary wavelength (e.g., (F)) between the initial external cavity longitudinal modes (D) and (E) can be oscillated, as shown in FIG. 3.

Assuming that the designated wavelength λs is to be oscillated, a method of setting and controlling the injection current to the phase adjustment area 16b and the rotation angle of the diffraction grating 3 will be described below with reference to steps (S21 to S25) and (S211 to S214) in FIG. 13.

(S21) The designated wavelength λs is set from an operation unit 19 such as a keyboard.

(S22) The oscillation wavelength control unit 18 receives the information of the designated wavelength λs, (S211) calculates the incident angle θ of the diffraction grating 3, (S212) outputs a rotation drive signal corresponding to the incident angle θ to the diffraction grating 3, (S213) calculates the current value to be injected to the phase adjustment area 16b of the LD 16, and (S214) outputs the injection current value to the current injection unit 17.

Note that the current value is calculated on the basis of the characteristic data (relationship between the designated wavelength λs and the injection current value) of the phase adjustment area 16b, which is measured in advance and stored in a memory 20 (the memory 20 may be incorporated in the oscillation wavelength control unit 18).

(S23) The diffraction grating 3 is rotated in accordance with the rotation drive signal output from the oscillation wavelength control unit 18 to set the incident angle θ.

(S24) The current injection unit 17 injects the current to the phase adjustment area 16b on the basis of the injection current value output from the oscillation wavelength control unit 18.

(S25) A laser beam having the designated wavelength λs is oscillated.

Figure 13:
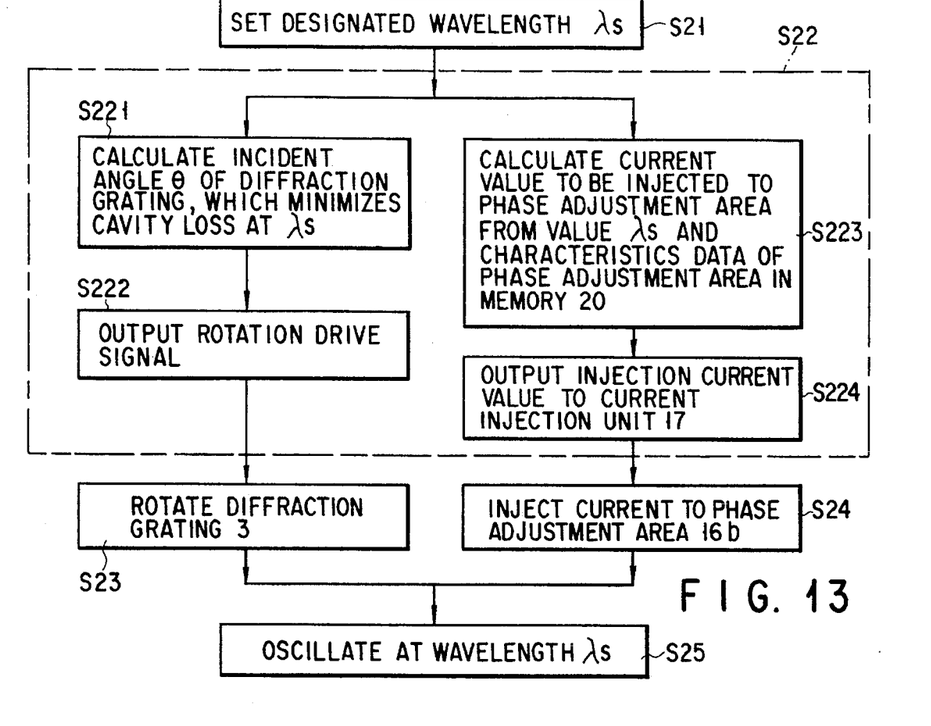
FIG. 13 is a flow chart showing a method of setting and controlling an injection current to a phase adjustment area and the rotation angle of a diffraction grating.

In oscillation of the designated wavelength λs, as described in FIG. 13, if the angle setting resolution of the rotation mechanism of the diffraction grating 3 for setting the incident angle θ is lower than that of the designated wavelength λs (setting resolution for the current to be injected to the phase adjustment area 16b), a wavelength difference Δλs may be generated between a wavelength λmin for minimizing the cavity loss and the designated wavelength λs in some cases, as shown in FIG. 5. In this case, however, as far as the wavelength difference Δλs is smaller than ½ an external cavity longitudinal mode spacing Δλ, oscillation is performed at the designated wavelength λs. That is, the external cavity longitudinal mode set at the designated wavelength λs becomes the oscillation longitudinal mode. The diffraction grating 3 using a normal rotation mechanism has an angle setting resolution for suppressing the wavelength difference Δλs within a range of Δλ/2.

The embodiment in FIG. 11 will be described below in more detail using practical values.

Assume that the initial effective cavity length K of the external cavity is set to 30 mm, and the initial wavelength λ is set to 1.55 λm. At this time, the external cavity longitudinal mode spacing Δλ is obtained in accordance with equation (3) as follows:

$$\Delta\lambda = \lambda^2/2L \neq 40 \text{ pm} \quad (13)$$

Assume that, upon current injection from the current injection unit 17, the refractive index of the phase adjustment area 16b decreases by 0.2% from 3.5 to 3.493. In this case, when the mechanical length of the phase adjustment area 16b is 250 μm, the effective optical path of the phase adjustment area 16b decreases by 1.75 μm from 875 μm to 873.25 μm. Therefore, a change in effective cavity length K is −1.75 μm. A change in wavelength Δλ' of the external cavity longitudinal mode is obtained in accordance with equation (4) as follows:

$$\Delta\lambda' = (1.55\times10^{-6})\times\{(1.75\times10^{-6})/(30\times10^{-3})\} \neq 90.4 \text{ pm} \quad (14)$$

In accordance with equation (13), the external cavity longitudinal mode spacing Δλ is calculated as 40 pm. Therefore, as described above, tunable oscillation can be performed within a wavelength range of about 90 pm which is twice or more the external cavity longitudinal mode spacing Δλ while holding the same external cavity longitudinal mode.

FIG. 6 is a graph showing the measurement value of a change in refractive index of the phase adjustment area 16*b* when the bias current to be injected to the phase adjustment area 16*b* of the two-electrode LD 16 is changed (phase adjustment area length: 250 μm). In this embodiment as well, as is apparent from FIG. 6, when the bias current is set to about 8 mA, a change in refractive index of 0.2% as described above can be realized.

In the tunable wavelength light source according to this embodiment as well, it is preferable that a wide wavelength tunable range is obtained while holding the same external cavity longitudinal mode. The following two methods are used as a method of extending the tunable range, as in the first embodiment.

As the first method, the mechanical length of the phase adjustment area 16*b* is increased. When the mechanical length of the phase adjustment area 16*b*, which exhibits the characteristics in FIG. 6, is increased from 250 μm to twice the length, i.e., 500 μm, a change in effective cavity length K increases by 1.5 times from −1.75 μm to −2.625 μm upon injection of the phase current of about 8 mA. Therefore, a wavelength tunable range 1.5 times that according to equation (14) can be obtained.

As the second method, the effective cavity length K of the external cavity is decreased. If the effective cavity length K is decreased from 30 mm to ½ the length, i.e., 15 mm, a wavelength tunable range twice that according to equation (14) can be obtained. In this case, however, the injection current to the phase adjustment area 16*b* is the same as in equation (14).

(Fourth Embodiment)

Figure 14:
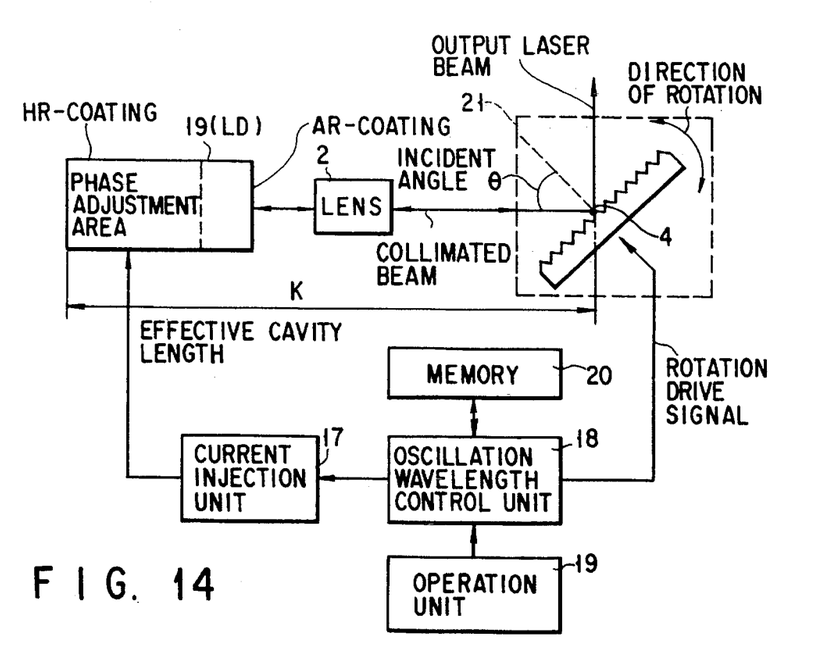
FIG. 14 is a block diagram of a tunable wavelength light source according to the fourth embodiment of the present invention.

FIG. 14 is a block diagram of a tunable wavelength light source according to the fourth embodiment.

This embodiment is different from the third embodiment (FIG. 11) in the following point. That is, an end face opposing the AR-coated end face of an LD 19 as a two-electrode LD is HR-coated (HR: High-Reflection), thereby extracting an output laser beam from a direction of 0th-order light (direction of total reflection) of a diffraction grating 3. Therefore, since the 0th-order light is used as output light, the output power increases as compared to the arrangement in FIG. 11.

(Fifth Embodiment)

Figure 15:
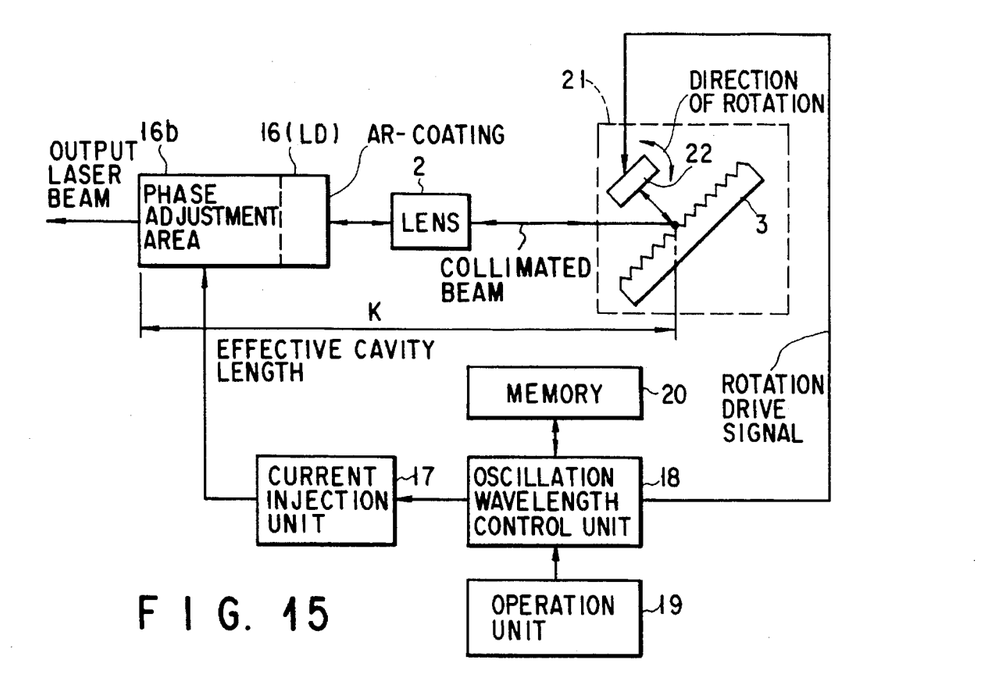
FIG. 15 is a block diagram of a tunable wavelength light source according to the fifth embodiment of the present invention.

FIG. 15 is a block diagram of a tunable wavelength light source according to the fifth embodiment.

In this embodiment, the reflector 21 having a wavelength selectivity in the third embodiment (FIG. 11) is constituted by a diffraction grating 3 and a total reflecting mirror 22, and a rotation drive signal is supplied from an oscillation wavelength control unit 18 to the total reflecting mirror 22. Wavelength selection by the reflector 21 is performed by rotating the total reflecting mirror 22 (rotation angle of the diffraction grating 3 is fixed).

Therefore, a light beam emitted from an LD 16 is collimated by a lens 2, incident on the diffraction grating 3, and spectrally dispersed. The spectrally dispersed light beam is incident on the total reflecting mirror 22, reflected along the same optical path, and incident on the diffraction grating 3. The light beam is spectrally dispersed again and returns to the LD 16.

In this case, the light beam emitted from the LD 16 is spectrally dispersed twice by the diffraction grating 3 during one reciprocation in the external cavity. The cavity loss by the diffraction grating 3 becomes steeper than that during one spectral dispersion. Therefore, since the side modes of an oscillation mode are suppressed as compared to those in one spectral dispersion, the monochromaticity of an output laser beam increases. When a cavity loss in one spectral dispersion is represented by A in FIG. 18, a cavity loss in twice spectral dispersion becomes steeper as represented by B in FIG. 18. When output level characteristics in one spectral dispersion are represented by C in FIG. 18, output level characteristics in two-time spectral dispersion are represented by D in FIG. 18. In this case, the side modes are suppressed by only G.

(Sixth Embodiment)

Figure 16:
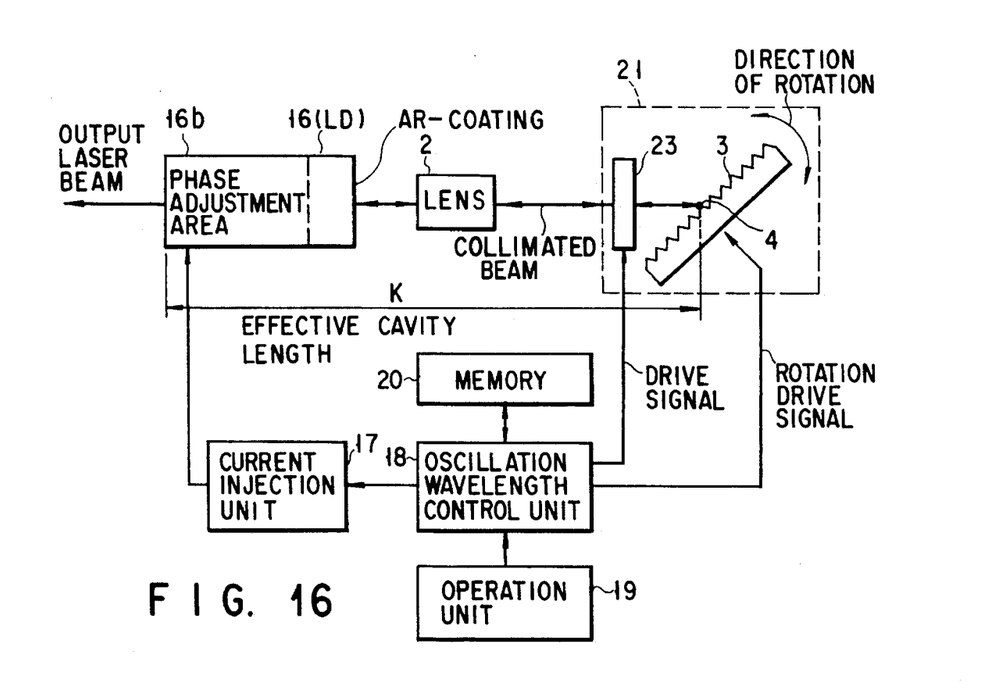
FIG. 16 is a block diagram of a tunable wavelength light source according to the sixth embodiment of the present invention.

FIG. 16 is a block diagram of a tunable wavelength light source according to the sixth embodiment.

In this embodiment, the reflector 21 having a wavelength selectivity in the third embodiment (FIG. 11) is constituted by a diffraction grating 3 and a tunable wavelength filter 23, and a rotation drive signal and a drive signal are supplied from an oscillation wavelength control unit 18 to the diffraction grating 3 and the tunable wavelength filter 23, respectively. Wavelength selection by the reflector 21 is performed by setting the rotation angle of the diffraction grating 3, as in FIG. 11, and controlling the tunable wavelength filter 23. Note that an etalon filter or a dielectric multilayered filter can be used as the tunable wavelength filter 23.

In this case, since a light beam emitted from the LD 16 passes through the tunable wavelength filter 23 twice, the wavelength is effectively limited, and the cavity loss becomes steeper than that in the arrangement having only the diffraction grating 3. Therefore, as described in the sixth embodiment, the monochromaticity of the output laser beam increases as compared to the arrangement having only the diffraction grating 3.

(Seventh Embodiment)

Figure 17:
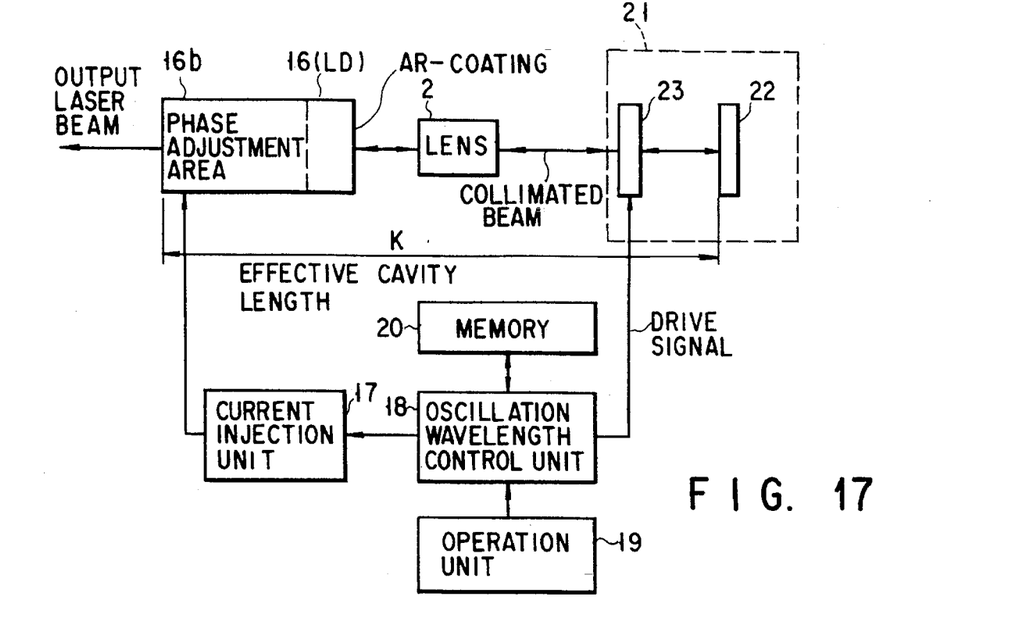
FIG. 17 is a block diagram of a tunable wavelength light source according to the seventh embodiment of the present invention.
Figure 18:
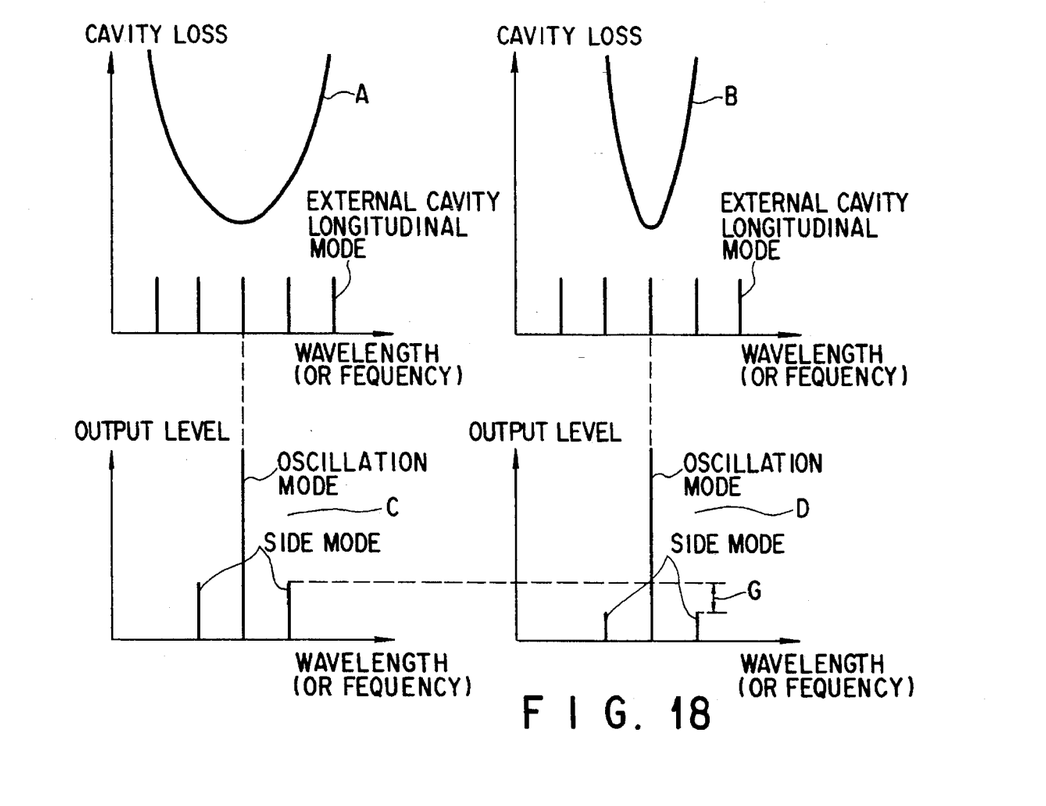
FIG. 18 is a view for explaining the relationship between a cavity loss and an oscillation side mode.

FIG. 17 is a block diagram of a tunable wavelength light source according to the seventh embodiment.

In this embodiment, the reflector 21 having a wavelength selectivity in the third embodiment (FIG. 11) is constituted by a tunable wavelength filter 23 and a total reflecting mirror 22, and a drive signal is supplied from an oscillation wavelength control unit 18 to the tunable wavelength filter 23. Therefore, wavelength selection by the reflector 21 is performed by controlling the tunable wavelength filter 23.

(Another Embodiment)

In the fifth and sixth embodiments, 0th-order light can be used to increase the output power, as in the second embodiment. More specifically, referring to FIGS. 15 and 16, the end face of the LD 16, which is not AR-coated, is HR-coated, thereby extracting the output laser beam from a direction of 0th-order light (direction of total reflection) of the diffraction grating 3.

In addition, in the seventh embodiment (FIG. 17), the end face of the LD 16, which is not AR-coated, is HR-coated, and the total reflecting mirror 22 is replaced with a half mirror. With this arrangement, the output laser beam can be extracted from this half mirror.

Furthermore, in the third to seventh embodiments as well, if the refractive index of the AR-coated end face of the LD 16 (LD 19) is large, an internal longitudinal mode (Fabry-Pérot mode of a cavity formed between the AR-coated end face and the end face which is not AR-coated) may be generated in the LD 16, and the set external cavity longitudinal mode may not oscillate. In this case, the following countermeasures are taken, as in the first and second embodiments.

(1) AR coating at a higher quality is performed on the end face of the LD 16, which is to be AR-coated.

(2) When the reflector 21 includes the diffraction grating 3 as a constituent element, the diffraction grating 3 having a smaller grating constant d (FIG. 9) is used. Alternatively, the diameter of the lens 2 is increased to increase the diameter of the beam incident on the diffraction grating 3. With these methods, the wavelength characteristics of the cavity loss determined by the characteristics of the diffraction grating 3 are made steeper. That is, Q of the diffraction grating 3 is increased.

(3) When the reflector 21 includes the tunable wavelength filter 23 as a constituent element, the tunable wavelength filter 23 for making the cavity loss steeper is used.

As described above, the tunable wavelength light source according to the third to seventh embodiments of the present invention comprises an LD having a phase adjustment area for changing the effective cavity length of an external cavity in accordance with a current to be injected, a current injection unit for injecting the current to the phase adjustment area, and an oscillation wavelength control unit for controlling the current to be injected from the current injection unit and controlling a wavelength to be selected by a reflector having a wavelength selectivity such that a desired wavelength is oscillated. A driving component for mechanically changing the cavity length becomes unnecessary. Therefore, size reduction of the apparatus can be achieved, and the operability can also be largely improved.

Since the number of components such as a driving component is reduced, and not a mechanical method but an electrical method is used to change the cavity length, the reliability of the apparatus can be improved.

The tunable wavelength light source according to the third to seventh embodiments of the present invention can be effectively applied to a heterodyne coherent optical communication system or a wavelength multiplexing communication system, which requires an excellent reproducibility and a high resolution, as in the first and second embodiments.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A tunable wavelength light source, comprising:

a semiconductor laser having first and second end faces capable of emitting a laser beam and opposing each other, and a phase adjustment area, said first end face being AR-coated;

a diffraction grating, arranged on an optical path of the laser beam emitted from said first end face, for spectrally dispersing the laser beam emitted from said first end face of said semiconductor laser and returning only a light component having a specific wavelength to said first end face, thereby forming an external cavity having a cavity length corresponding to a distance between said second end face of said semiconductor laser and a spectral dispersion surface of said diffraction grating, said external cavity oscillating an external cavity longitudinal mode based on the cavity length;

current injection means for injecting a current to said phase adjustment area of said semiconductor laser, thereby changing an effective cavity length of said external cavity; and oscillation wavelength control means for controlling a current value to be injected from said current injection means and controlling a wavelength to be selected by said diffraction grating so as to oscillate a light beam having a desired wavelength between said external cavity longitudinal modes in order that the wavelength of the laser beam emitted from said second end face of said semiconductor laser can be changed while holding a predetermined cavity length of said external cavity.

2. A source according to claim 1, further comprising lens means for collimating the laser beam emitted from said first end face of said semiconductor laser toward said diffraction grating and returning the light component having the specific wavelength from said diffraction grating to said first end face of said semiconductor.

3. A source according to claim 1, further comprising memory means for storing the current value controlled by said oscillation wavelength control means as a measurement value based on characteristics of said phase adjustment area of said semiconductor laser in advance.

4. A source according to claim 1, wherein said semiconductor laser is constituted by a two-electrode laser diode having a first electrode for injecting the current to an active area having an optical amplification function to perform laser oscillation, and a second electrode, arranged adjacent to said active area, for injecting the current to said phase adjustment area having a function of tuning the wavelength of laser oscillation, thereby changing an effective optical path of said phase adjustment area.

5. A tunable wavelength light source, comprising:

a semiconductor laser having first and second end faces opposing each other and a phase adjustment area, said first end face being capable of emitting a laser beam and AR-coated, and said second end face being HR-coated;

a diffraction grating, arranged on an optical path of the laser beam emitted from said first end face, for spectrally dispersing the laser beam emitted from said first end face of said semiconductor laser and returning only a light component having a specific wavelength to said first end face, thereby forming an external cavity having a cavity length corresponding to a distance between said second end face of said semiconductor laser and a spectral dispersion surface of said diffraction grating, said external cavity oscillating an external cavity longitudinal mode based on the cavity length;

current injection means for injecting a current to said phase adjustment area of said semiconductor laser, thereby changing an effective cavity length of said external cavity; and oscillation wavelength control means for controlling a current value to be injected from said current injection means and controlling a wavelength to be selected by said diffraction grating so as to oscillate a light beam having a desired wavelength between said external cavity longitudinal modes in order that the wavelength of the laser beam emitted from a direction of total reflection of said diffraction grating can be changed while holding a predetermined cavity length of said external cavity.

6. A source according to claim 5, further comprising lens means for collimating the laser beam emitted from said first end face of said semiconductor laser toward said diffraction grating and returning the light component having the specific wavelength from said diffraction grating to said first end face of said semiconductor.

7. A source according to claim 5, further comprising memory means for storing the current value controlled by said oscillation wavelength control means as a measurement value based on characteristics of said phase adjustment area of said semiconductor laser in advance.

8. A source according to claim 5, wherein said semiconductor laser is constituted by a two-electrode laser diode having a first electrode for injecting the current to an active area having an optical amplification function to perform laser oscillation, and a second electrode, arranged adjacent to said active area, for injecting the current to said phase adjustment area having a function of tuning the wavelength of oscillation, thereby changing an effective optical path of said phase adjustment area.

9. A tunable wavelength light source, comprising:

a semiconductor laser having first and second end faces capable of emitting a laser beam and opposing each other, and a phase adjustment area, said first end face being AR-coated;

a reflector, having a wavelength selectivity for receiving the laser beam emitted from said first end face of said semiconductor laser and reflecting only a light component having a specific wavelength of the laser beam to said first end face and arranged on an optical path of the laser beam emitted from said first end face to form an external cavity having a cavity length corresponding to a distance between said second end face of said semiconductor laser and a reflection surface of said reflector, said external cavity oscillating an external cavity longitudinal mode based on the cavity length;

current injection means for injecting a current to said phase adjustment area of said semiconductor laser, thereby changing an effective cavity length of said external cavity; and oscillation wavelength control means for controlling a current value to be injected from said current injection means and controlling a wavelength to be selected by said reflector so as to oscillate a light beam having a desired wavelength between said external cavity longitudinal modes in order that the wavelength of the laser beam emitted from said second end face of said semiconductor laser can be changed while holding a predetermined cavity length of said external cavity.

10. A source according to claim 9, further comprising lens means for collimating the laser beam emitted from said first end face of said semiconductor laser toward said reflector and returning the light component having the specific wavelength from said reflector to said first end face of said semiconductor.

11. A source according to claim 9, further comprising memory means for storing the current value controlled by said oscillation wavelength control means as a measurement value based on characteristics of said phase adjustment area of said semiconductor laser in advance.

12. A source according to claim 9, wherein said semiconductor laser is constituted by a two-electrode laser diode having a first electrode for injecting the current to an active area having an optical amplification function to perform laser oscillation, and a second electrode, arranged adjacent to said active area, for injecting the current to said phase adjustment area having a function of tuning the wavelength of laser oscillation, thereby changing an effective optical path of said phase adjustment area.

13. A source according to claim 9, wherein said reflector is constituted by a diffraction grating.

14. A source according to claim 9, wherein said reflector comprises a diffraction grating for spectrally dispersing the laser beam emitted from said first end face of said semiconductor laser, and a total reflecting mirror for returning the light beam spectrally dispersed by said diffraction grating to said diffraction grating again.

15. A source according to claim 9, wherein said reflector comprises a tunable wavelength filter for controlling a wavelength bandwidth of the laser beam emitted from said first end face of said semiconductor laser, and a diffraction grating for spectrally dispersing a light component whose wavelength bandwidth is limited by said tunable wavelength filter and returning the light component to said tunable wavelength filter again.

16. A source according to claim 9, wherein said reflector comprises a tunable wavelength filter for limiting a wavelength bandwidth of the laser beam emitted from said first end face of said semiconductor laser, and a total reflecting mirror for totally reflecting a light component whose wavelength bandwidth is limited by said tunable wavelength filter and returning the light component to said tunable wavelength filter again.

17. A tunable wavelength light source, comprising:

a semiconductor laser having first and second end faces opposing each other and a phase adjustment area, said first end face being capable of emitting a laser beam and AR-coated, and said second end face being HR-coated;

a reflector, having a wavelength selectivity for receiving the laser beam emitted from said first end face of said semiconductor laser and reflecting only a light component having a specific wavelength of the laser beam to said first end face and arranged on an optical path of the laser beam emitted from said first end face to form an external cavity having a cavity length corresponding to a distance between said second end face of said semiconductor laser and a reflection surface of said reflector, said external cavity oscillating an external cavity longitudinal mode based on the cavity length;

current injection means for injecting a current to said phase adjustment area of said semiconductor laser, thereby changing an effective cavity length of said external cavity; and oscillation wavelength control means for controlling a current value to be injected from said current injection means and controlling a wavelength to be selected by said reflector so as to oscillate a light beam having a desired wavelength between said external cavity longitudinal modes in order that the wavelength of the laser beam emitted from a direction of total reflection of said reflector can be changed while holding a predetermined cavity length of said external cavity.

18. A source according to claim 17, further comprising lens means for collimating the laser beam emitted from said first end face of said semiconductor laser toward said reflector and returning the light component having the specific wavelength from said reflector to said first end face of said semiconductor.

19. A source according to claim 17, further comprising memory means for storing the current value controlled by said oscillation wavelength control means as a measurement value based on characteristics of said phase adjustment area of said semiconductor laser in advance.

20. A source according to claim 17, wherein said semiconductor laser is constituted by a two-electrode laser diode having a first electrode for injecting the current to an active area having an optical amplification function to perform laser oscillation, and a second electrode, arranged adjacent to said active area, for injecting the current to said phase adjustment area having a function of tuning the wavelength of oscillation, thereby changing an effective optical path of said phase adjustment area.

* * * * *